(12) United States Patent
Huang et al.

(10) Patent No.: US 6,870,387 B2
(45) Date of Patent: Mar. 22, 2005

(54) METHOD AND TEST STRUCTURES FOR MEASURING INTERCONNECT COUPLING CAPACITANCE IN AN IC CHIP

(75) Inventors: Kai-Ye Huang, Taipei (TW); Chuan-Jane Chao, Hsinchu (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 10/699,830

(22) Filed: Nov. 4, 2003

(65) Prior Publication Data

US 2005/0024077 A1 Feb. 3, 2005

(30) Foreign Application Priority Data

Jul. 28, 2003 (TW) .......................................... 92120564

(51) Int. Cl.$^7$ ............................................. G01R 31/26
(52) U.S. Cl. ................................. 324/765; 324/158.1
(58) Field of Search ............................... 324/765, 763, 324/158.1, 719; 714/733, 734; 257/48

(56) References Cited

U.S. PATENT DOCUMENTS 5,999,010 A * 12/1999 Arora et al. ................ 324/765
6,404,222 B1 * 6/2002 Fan et al. ................... 324/765
6,788,074 B2 * 9/2004 Sarma et al. ............... 324/663

* cited by examiner

*Primary Examiner*—David Zarneke
*Assistant Examiner*—Tung X. Nguyen
(74) *Attorney, Agent, or Firm*—Baker & Hostetler LLP

(57) ABSTRACT

Measurement method and test structures for measuring interconnect coupling capacitance in an IC chip are provided. This method employs CBCM technique. In the first step, two test structures are used to measure a target configuration in order to obtain the total capacitance C of a metal line with respect to ground including line-to-line, fringe and area components ($C=2C_c+2C_f+C_a$). In the second step, two other test structures are used to measure a dummy configuration in order to obtain the area and fringe capacitance $C_{dummy}$ of the metal line with respect to ground including fringe and area components ($C_{dummy}=2C_f+C_a$). After the two steps, the coupling capacitance $C_c$ between the metal line and another line can be determined according to the formula $C_c=(C-C_{dummy})/2$.

13 Claims, 5 Drawing Sheets

METHOD AND TEST STRUCTURES FOR MEASURING INTERCONNECT COUPLING CAPACITANCE IN AN IC CHIP

BACKGROUND OF THE INVENTION

1. Field of Invention

The present invention relates to the measurement of capacitances, and more specifically to measurement of the coupling capacitance between interconnect lines of an integrated circuit (IC) structure.

2. Description of Related Art

As transistor scaling continues, gate delay is no longer the major limit of circuit speed and instead interconnect delay dominates the circuit performance. In addition, as interconnection becomes multi-layers, more complex and more close, the crosstalk coupling effect between wires becomes a source of noise in deep sub-micron analog and digital circuits, which can result in chip functional failures. Therefore, to extract accurate interconnect parameters for circuit simulation or for circuit failure analysis is needed and important.

In order to evaluate the coupling effect between interconnect lines, it's necessary to ascertain the coupling capacitances between lines. The coupling capacitance includes both intra-layer capacitance, which occurs in a same layer, and inter-layer capacitance, which occurs in different layers. Some reasons to show the necessity for measurement accuracy of lateral intra-layer coupling capacitance parameters are as follows. First, increasing metal aspect ratio (thickness/width) can improve RC delay, but the performance benefit will eventually saturate when the lateral intra-layer coupling capacitance becomes the dominant contributor to the wire total capacitance, as reported by M. Bohr, "Interconnect scaling—the real limiter to high performance ULSI," IEEE Tech. Digest IEDM, 1995, pp. 241–244. Second, in order not to increase interconnect resistance significantly, metal thickness is not scaled with the metal pitch and usually is kept to be the same. As a result, the lateral intra-layer coupling capacitance will be the dominant portion of total wire capacitance in advanced processes.

There are two types of test structures that are normally used to measure interconnect coupling capacitances, the off-chip or passive test structures and the on-chip or active test structures. The passive test structures require very large geometries to increase capacitance values and the capacitance is measured directly using an impedance meter. Unlike the off-chip direct method, the on-chip method uses active devices to apply currents to charge or discharge capacitances of the interconnect lines. In this method, capacitance is a derived quantity, obtained by measuring the capacitive currents, and hence this method is an indirect method. One indirect method, called as Charge Based Capacitance Measurement (CBCM), was proposed by Bernard Laquai et al., "An new method and test structure for easy determination of femto-farad on-chip capacitance in a MOS process," Proc. IEEE, vol. 5, 1992, pp. 62–66. The approach uses the average current supplied to the inverter and the given clock frequency to derive the loading capacitance, which can make a measurement with femto-farad resolution. J. Chen et al. disclosed an improved test method with 0.01fF resolution in "An on-chip attofarad interconnect charge-based capacitance measurement (CBCM) technique," Proc. of IEDM, 1996, pp. 69–72 and "An on-chip, interconnect capacitance characterization method with sub-femto-farad resolution," IEEE Transactions on Semiconductor Manufacturing, Vol. 11, 1998.

In the CBCM technique, a pair of inverters with two individual test structures 112, a target test structure and a dummy/reference test structure, are used to deduce the wanted capacitance as shown in FIG. 1. The substrate in an IC chip on which the integrated circuits and test structures are formed is normally treated as a ground plane (grounded). The two test structures 112 are coupled to the output terminals $V_{out1}$ and $V_{out2}$ of the two inverters respectively. The left-hand side inverter in FIG. 1 is comprised of a pair of transistors, a first P type Metal-Oxide-Semiconductor (PMOS) transistor 102 and a first N type Metal-Oxide-Semiconductor (NMOS) transistor 104. The right-hand side inverter in FIG. 1 is comprised of a pair of transistors, a second PMOS transistor 114 and a second NMOS transistor 116. Clock voltage signals $V_1$ and $V_2$ are two non-overlap signals, whose waveforms are shown in FIG. 2, to avoid a direct current path (short path) from power supply terminal 106 (with a voltage $V_{dd}$) to ground 110 at transients during signal switching. Two DC current meters 108 denoted by A1 and A2 are used to monitor the currents flowing through the inverters in FIG. 1, respectively. Here, only average currents need to be measured.

According to J. Chen's method, a target test structure for intra-layer capacitance extraction is illustrated in FIG. 3. It comprises a comb line 300 surrounded by a meander line 302. The meander line is connected to ground 304 and the comb line 300 is connected to the output terminal $V_{out1}$ of the left-hand side inverter in FIG. 1. The comb line 300 is laterally separated by a specific distance of s from the meander line 302. The total coupling capacitance includes the area, fringe, and line-to-line coupling components. To eliminate undesired components, a dummy test structure is designed as shown in FIG. 4. A comb line 400 is connected to the output terminal $V_{out2}$ of the right-hand side inverter in FIG. 1, and a short meander line 402 is connected to ground 404. The line-to-line coupling component for part of the comb line 300 of FIG. 3 with length L is to be extracted. The dummy test structure is intended to emulate the capacitance of the comb line 300 with respect to ground of FIG. 3 except the line-to-line coupling component between the comb line 300 and each of its neighboring parts of the meander line 302.

FIG. 5 and FIG. 6 are the cross-sectional views of FIG. 3 and FIG. 4, respectively. The connection of the meander line 302 to ground 304 is also shown in FIG. 5. FIG. 6 illustrates the cross section of only part of the comb line 400 without laterally neighboring parts of the meander line 402. The substrate of the IC chip is connected to ground 500. The average current I flowing through an inverter can be described as Eq. (1) where $V_{dd}$ is the power supply voltage, f is the frequency of the clock signals $V_1$ and $V_2$, and the total loading capacitance of the output terminal of the inverter is $C_{tot}$.

$$I = C_{tot} * V_{dd} * f \quad (1)$$

According to FIG. 5 and FIG. 6, their total capacitances $C_{tot1}$, $C_{tot2}$ are composed as follows, respectively:

$$C_{tot1} = 2C_c + 2C_{f1} + C_{a1} + C_{stray1} \quad (2)$$

$$C_{tot2} = 2C_{f2} + C_{a2} + C_{stray2} \quad (3)$$

In Eq. (2) for the target test structure, $C_c$ denotes the target line-to-line coupling capacitance, $C_{f1}$ denotes the fringe capacitance between the lateral edge of the comb line 300 and the ground plane (substrate), $C_{a1}$ is the area capacitance between the bottom of the comb line 300 and the ground plane, and $C_{stray1}$ is the stray capacitance of the left-hand side inverter itself. $C_{f2}$, $C_{a2}$, and $C_{stray2}$ are the counterpart components for the dummy test structure.

If mismatching effect of the two inverters in FIG. 1 and interconnection is ignored, $C_{stray1}$ is equal to $C_{stray2}$ and $C_{a1}$ is equal to $C_{a2}$. The difference between the charging current $I_1$ of the left-hand side inverter and the charging current $I_2$ of the right-hand side inverter is given as $$I_1-I_2=(C_{tot1}-C_{tot2})*V_{dd}*f=[2C_c+2(C_{f1}-C_{f2})]*V_{dd}*f \qquad (4)$$

Generally, the fringe component is not negligible compared to the line-to-line coupling component. Moreover, due to different charge distributions between both of the comb lines 300, 400 with and without neighboring ground wires on the same layer and the substrate, $C_{f1}$ is smaller than $C_{f2}$ and the total coupling capacitance to substrate of a comb line without neighboring ground wires is much larger than that of the same comb line with neighboring ground wires. Because of the big difference between $C_{f1}$ and $C_{f2}$ introduced into Eq. (4), the extracted intra-layer coupling capacitance when the comb line 300 and the meander line 302 are in the same layer is inaccurate and underestimated. From a 2-D simulation on a 0.6 um technology, the metal-1 coupling capacitance to substrate of a comb line without neighboring wires is 2.6 times that with neighboring wires ($C_{a1}+2C_{f1}=0.0395$ fF/um, $C_{a2}+2C_{f2}=0.1029$ fF/um, width/space=0.6 um/0.6 um, dielectric thickness=7000 Angstrom, $C_c$ is just only 0.092 fF/um). For the above reason, these two test structures are only suitable for inter-layer coupling capacitance extraction when the meander line is not in the same layer as the comb line, where the charge distributions are approximately the same.

Besides, the error induced by the mismatch between the two inverters is another important issue of CBCM method. If mismatch can't be ignored, the difference of the two total capacitances $C_{tot1}$, $C_{tot2}$ caused by the line-to-line coupling component will be larger, so the error will be larger. Arora et al proposed a new structure in U.S. Pat. No. 5,999,010, Dec. 7, 1999, which also adopted CBCM technique. However, this method requires three measurement steps and needs more pads to implement the test structure, thus it's not suitable for an on-wafer measurement.

For the forgoing reasons, there is a need for a method and measuring device for measuring the line-to-line coupling capacitance between interconnect lines in an IC chip.

SUMMARY OF THE INVENTION

The purpose of the invention is to provide new test structures and a new measurement method employing the test structures for accurately measuring intra-layer coupling capacitance between interconnect lines of an integrated circuit structure formed on an IC chip.

In an embodiment of the invention two sets of test structures are employed. The first set is used to measure a target configuration. The target configuration primarily contains two branch circuits, which are the two inverters described above. The first set includes a first test structure and a second test structure. In order to obtain the total capacitance C of a central wire with length L, the first set attempts to extract the total wire capacitance with respect to ground including line-to-line, area, and fringe capacitances ($C=2 C_c+2C_f+C_a$).

The second set is used to measure a dummy configuration. The dummy configuration primarily contains two branch circuits, which are also the two inverters described above. The second set includes a third test structure and a fourth test structure. The second set attempts to extract the area and fringe capacitance $C_{dummy}$ of a wire with length L with respect to grounded substrate when it has two parallel wires placed on both sides respectively ($C_{dummy}=2C_f+C_a$). The three-wire structure is placed on the third test structure and a two-wire structure on the fourth test structure. Two cross-reference subordinate structures are placed on the third test structure and the fourth test structure respectively to cancel unnecessary capacitance components. By using CBCM technique, the desired capacitances C, $C_{dummy}$ can be obtained. Finally the line-to-line coupling capacitance Cc can be determined according to the formula $C_c=(C-C_{dummy})/2$. In each of the two steps, the mismatch between the two inverters is incorporated in the capacitances obtained, and therefore subtracting $C_{dummy}$ from C approximately cancels the mismatch components. As a result of this, Cc obtained is accurate.

In conclusion, the new structures and method of the invention can improve the disadvantages of previous methods and test structures in the art such as those mentioned in the background section and satisfy the requirements of reduced mismatch effect, small test structure size, simple measurement procedure, and high accuracy in intra-layer coupling capacitance extraction.

It is to be understood that both the foregoing general description and the following detailed description are exemplary, and are intended to provide further explanation of the invention as claimed.

BRIEF DESCRIPTION OF THE DRAWINGS

The foregoing and other features, aspects, and advantages of the present invention will become better understood with regard to the following description, appended claims, and accompanying drawings where:

DESCRIPTION OF THE PREFERRED EMBODIMENTS

Figure 1:
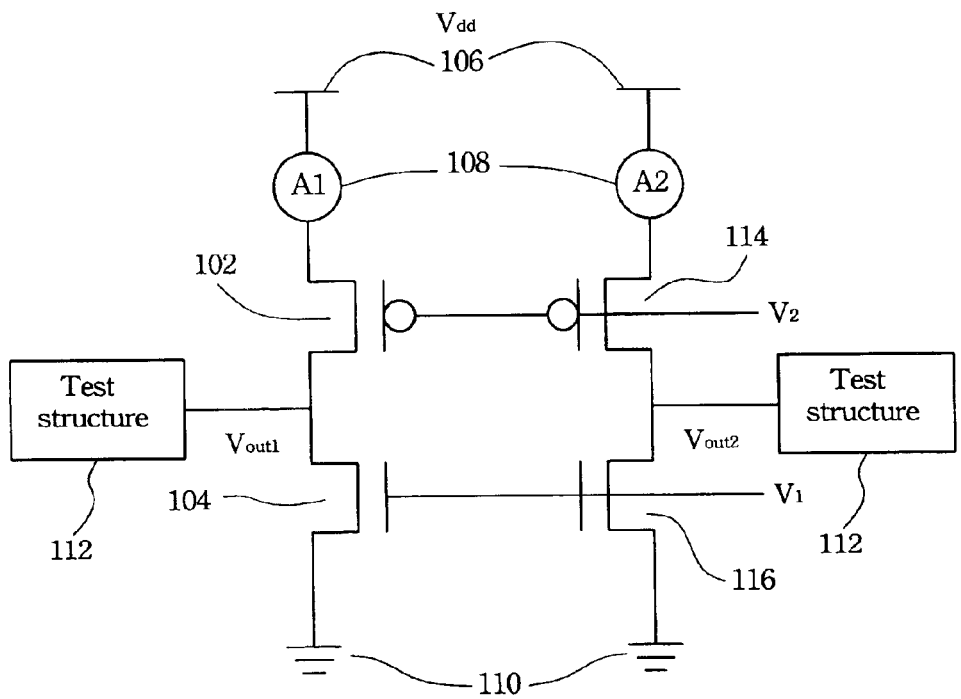
FIG. 1 illustrates the schematic and test configuration of CBCM technique.

This invention proposes a new two-step measurement method and test structures for measuring the coupling capacitance between interconnect lines of an integrated circuit structure formed on an IC chip. It also adopts CBCM technique but improves the dummy test structure of J. Chen's method, and two additional test structures are used.

The embodiments of the new test structures and procedures of the method are described in detail hereinafter.

The two-step measurement method is to measure a target configuration and a dummy configuration separately. The target configuration includes basically a first branch circuit and a second branch circuit, such as the two inverters in FIG. 1. The first branch circuit is the left-hand side inverter in FIG. 1 composed of the first PMOS transistor 102 and the first NMOS transistor 104. The first PMOS transistor 102 and the first NMOS transistor 104 are connected in series at the output terminal $V_{out1}$. An output terminal of the first PMOS transistor 102 (source terminal) is connected to the power supply terminal 106 (with a voltage $V_{dd}$) and an output terminal of the first NMOS transistor 104 (source terminal) is connected to ground 110. The second branch circuit is the right-hand side inverter in FIG. 1 composed of the second PMOS transistor 114 and the second NMOS transistor 116. The second PMOS transistor 114 and the second NMOS transistor 116 are connected in series at the output terminal $V_{out2}$. An output terminal of the second PMOS transistor 114 (source terminal) is connected to the power supply terminal 106 and an output terminal of the second NMOS transistor 116 (source terminal) is connected to ground 110.

Figure 2:
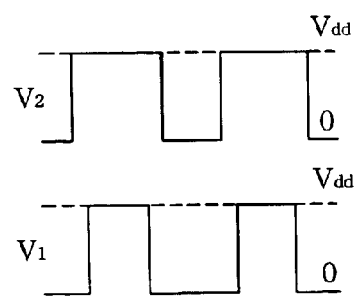
FIG. 2 illustrates the waveforms of two non-overlap voltage signals $V_1$ and $V_2$ with a pulse height of $V_{dd}$ and a clock frequency of f.
Figures 3, 4:
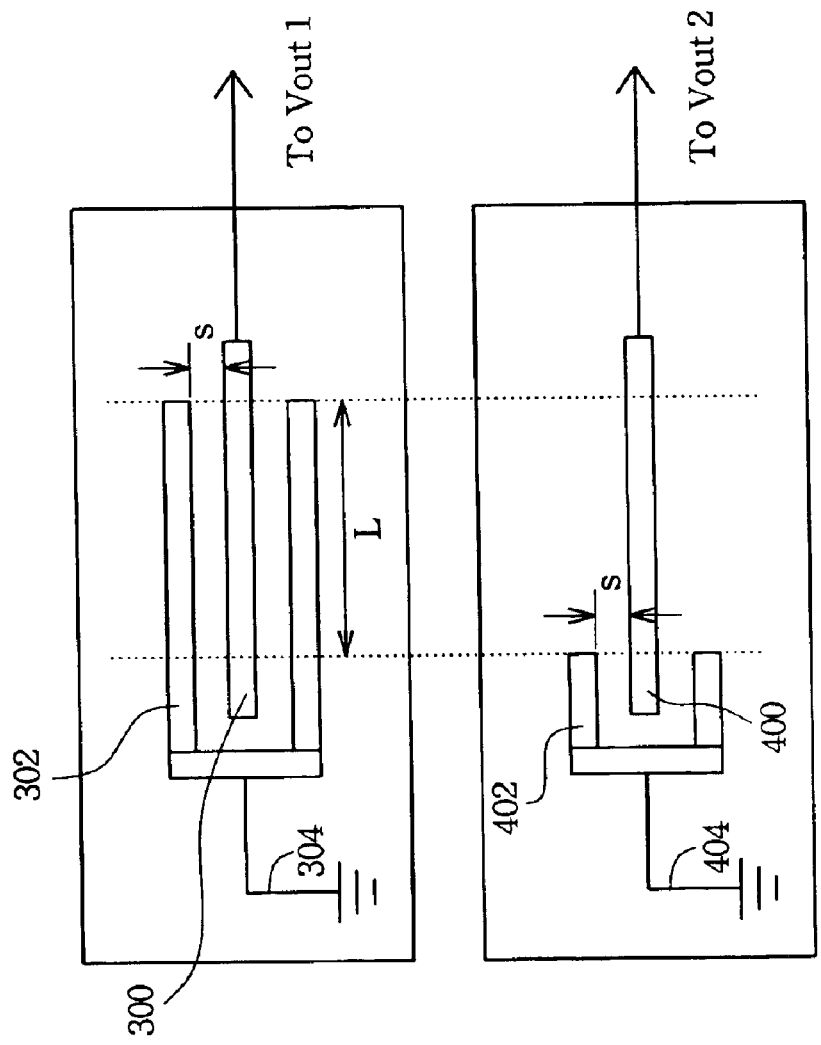
FIG. 3 is a top view of the target test structure in J. Chen's method.
FIG. 4 is a top view of the dummy test structure in J. Chen's method.
Figure 5:
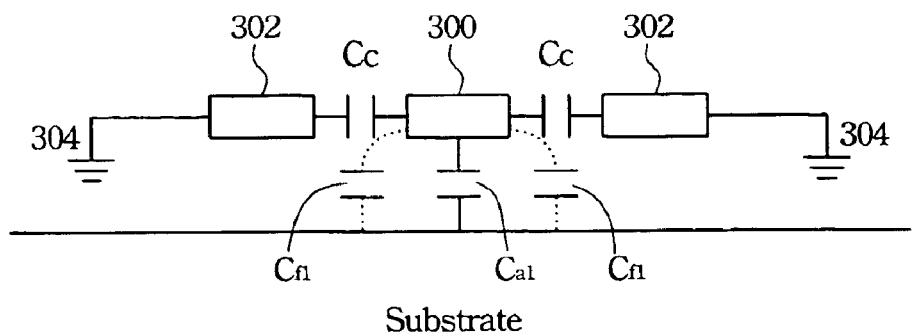
FIG. 5 is a cross-sectional view of FIG. 3.
Figure 6:
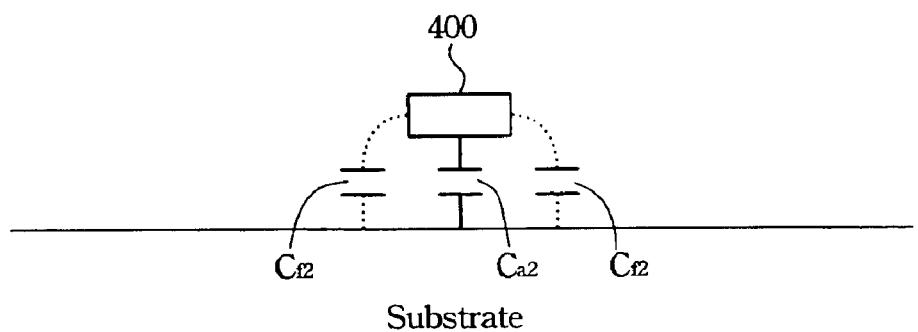
FIG. 6 illustrates the cross section of only part of the comb line 400 without laterally neighboring parts of the meander line 402.

Two DC current meters 108 denoted by A1 and A2 are used to monitor the currents flowing through the first branch circuit and the second branch circuit, respectively. Here, only average currents need to be measured. The first NMOS transistor 104 and the second NMOS transistor 116 are the same and their control terminals are connected and driven by a first clock voltage signal $V_1$. The first PMOS transistor 102 and the second PMOS transistor 114 are the same and their control terminals are connected and driven by a second clock voltage signal $V_2$. Accordingly, the first branch circuit and the second branch circuit are symmetric. The first clock voltage signal $V_1$ and the second clock voltage signal $V_2$ are two non-overlap signals, whose waveforms are shown in FIG. 2. They don't simultaneously turn on the first PMOS transistor 102 and the first NMOS transistor 104. They also don't simultaneously turn on the second PMOS transistor 114 and the second NMOS transistor 116.

The dummy configuration includes basically a third branch circuit and a fourth branch circuit, such as the two inverters in FIG. 1. The third branch circuit is the left-hand side inverter in FIG. 1. The fourth branch circuit is the right-hand side inverter in FIG. 1. The structure of and driving method for the third branch circuit are completely the same as those pertaining to the first branch circuit. Moreover, the structure of and driving method for the fourth branch circuit are completely the same as those pertaining to the second branch circuit. Therefore, the detailed constructions of the third branch circuit and the fourth branch circuit are not described herein again.

The test structures of the invention can be used to measure a first coupling capacitance C and a second coupling capacitance $C_{dummy}$ of a line A of an integrated circuit structure of length L. The substrate of the integrated circuit structure is grounded. The two-step measurement method of the invention is used to obtain a line-to-line coupling capacitance between the line A and another line B.

Figure 7:
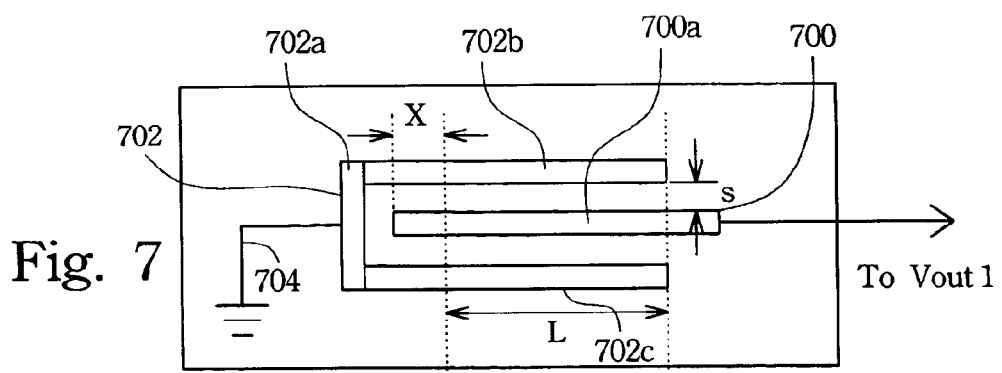
FIG. 7 is a top view of the first test structure of the invention according to an embodiment.
Figure 8:
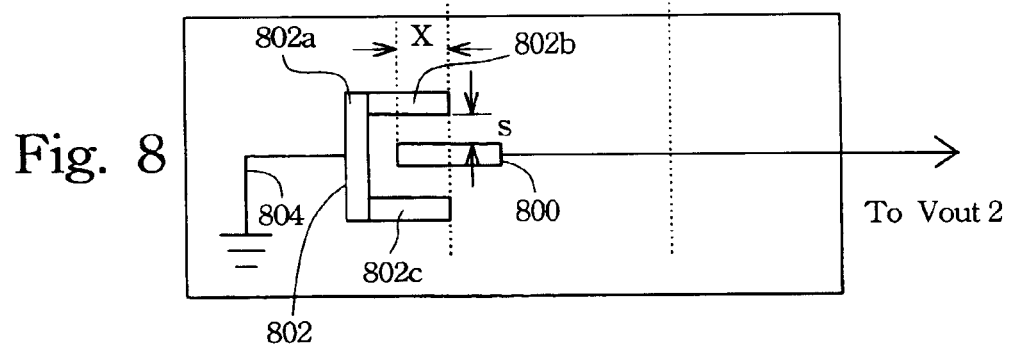
FIG. 8 is a top view of the second test structure of the invention according to an embodiment.

The first measurement step of the two-step method is to employ two test structures shown in FIG. 7 and FIG. 8 respectively. The test structure of FIG. 7 is a first test structure, which is a main test structure. In the first test structure, a comb line 700 is connected to the output terminal $V_{out1}$ of the first branch circuit in FIG. 1. Two metal portions of a meander line 702 with the same length are placed at the two sides of the comb line 700, which are parallel to and equally away from the comb line 700. The two metal portions are connected to ground 704 through another metal portion 702a of the meander line 702. As shown in FIG. 7, the distance between the comb line 700 and each of the neighboring portions is s and the parallel overlap length between them is x+L. The comb line 700 is the same as the line A, but the length of the comb line 700 is longer than that of the line A. Also, the meander line 702 is the same as the line B.

The test structure of FIG. 8 is a second test structure, which is a to reference test structure. In the second test structure, another metal line 800 is connected to the output terminal $V_{out2}$ of the second branch circuit in FIG. 1. Two metal portions 802b and 802c of another meander line 802 with the same length are placed at the two sides of the metal line 800, which are also parallel to and equally away from the metal line 800. The two metal portions 802b and 802c are connected to ground 804 through another metal portion 802a of the meander line 802. As shown in FIG. 8, the distance between the metal line 800 and each of the neighboring portions is s and the parallel overlap length between them is X. The metal line 800 is the same as the line A, and the meander line 802 is the same as the line B.

The first and second test structures are designed to measure the first coupling capacitance C of a part 700a of the comb line 700 with length L (equivalent to the line A of length L) with respect to ground. The first coupling capacitance C includes the line-to-line capacitance $C_c$ between the part 700a and each of two neighboring metal parts 702b and 702c of length L pertaining to the meander line 702, the fringe capacitance $C_f$ between each lateral edge of the part 700a and the substrate of the circuit, and the area capacitance $C_a$ between the bottom area of the part 700a and the substrate. Compared to the first test structure in FIG. 7, the second test structure in FIG. 8 doesn't have a metal part of length L corresponding to the part 700a with two neighboring parts. The length of the comb line 700 minus the length of the metal line 800 equals L, and the length of the two metal portions placed at the two sides of the comb line 700 minus the length of the two metal portions 802b and 802c equals L. Therefore, the total loading capacitance $C_{tot1}$ of the output terminal $V_{out1}$ of the first branch circuit with respect to ground and derived from the first test structure minus the total loading capacitance $C_{tot2}$ of the output terminal $V_{out2}$ of the second branch circuit with respect to ground and derived from the second test structure is the first coupling capacitance C. C is equal to $2C_c+2C_f+C_a$.

The procedures for obtaining the first coupling capacitance C are as follows. An average current $I_1$ flowing through the first branch circuit during a period of time is measured, and an average current $I_2$ flowing through the second branch circuit during the same period of time is also measured. According to the CBCM principle, $$I_1 = C_{tot1} * V_{dd} * f$$

$$I_2 = C_{tot2} * V_{dd} * f$$

and then the first coupling capacitance C is calculated from the equation $$C = C_{tot1} - C_{tot2} = (I_1 - I_2)/(V_{dd} * f)$$

wherein $V_{dd}$ is the voltage of the supply terminal 106 and f is the clock frequency of the first voltage signal $V_1$ and the second voltage signal $V_2$.

Figure 9:
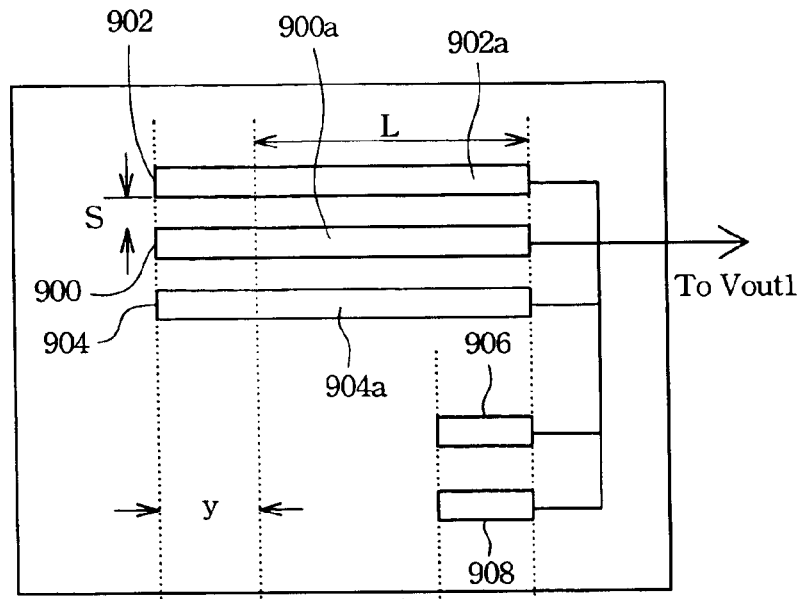
FIG. 9 is a top view of the third test structure of the invention according to an embodiment.
Figure 10:
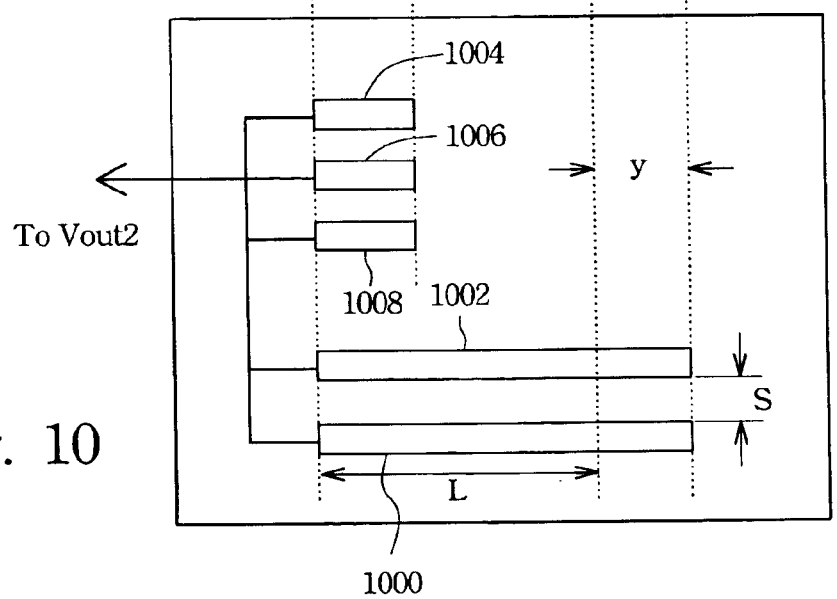
FIG. 10 is a top view of the fourth test structure of the invention according to an embodiment.

The second measurement step of the two-step method is to employ two other test structures, which are a third test structure and a fourth test structure shown in FIG. 9 and FIG. 10 respectively. In the third test structure of FIG. 9, there is a central metal line 900 of length y+L. Two metal lines 902 and 904 with the same length y+L are placed at the two sides of the central metal line 900, which are parallel to and equally away from the central metal line 900. As shown in FIG. 9, the distance between the central metal line 900 and each of the neighboring lines is s and the parallel overlap length between them is y+L. These three metal lines form a first subordinate structure in the third test structure and emulate the area and fringe capacitance of the part 700a in FIG. 7 with respect to ground. The third test structure also contains a second subordinate structure, which is described hereinafter. The central metal line 900 and the two metal lines 902 and 904 are all the same as the line A.

In the fourth test structure of FIG. 10, there are a third subordinate structure and a fourth subordinate structure. The third subordinate structure is described hereinafter. The fourth subordinate structure consists of two parallel metal lines 1000 and 1002 of length y+L spaced a distance of s apart and the parallel overlap length between them is y+L. The fourth subordinate structure emulates the total capacitance of the two metal lines 902 and 904. The two metal lines 1000 and 1002 are also the same as the line A.

The third and fourth test structures shown in FIG. 9 and FIG. 10 are designed to measure the second coupling capacitance $C_{dummy}$ of a part 900a of the central line 900 with an exact length L (equivalent to the line A of length L) with respect to the substrate of the circuit connected to ground. Note that the part 900a with length L emulates the area and fringe capacitance of the part 700a with length L with respect to ground. The second coupling capacitance $C_{dummy}$ includes the fringe capacitance $C_f$ between each lateral edge of the part 900a with length L and the substrate of the circuit, and the area capacitance $C_a$ between the bottom area of the part 900a and the substrate. $C_{dummy}$ is equal to $2C_f+C_a$. In order to achieve this goal, a cross-reference second subordinate structure consisting of two parallel metal lines 906 and 908 of length y is placed in the third test structure to cancel the effect of two metal parts of length y in the metal lines 1000 and 1002, respectively. The two metal lines 906 and 908 are spaced a distance s apart and the parallel overlap length between them is y. The two metal lines 906 and 908 are the same as the line A. In addition, a cross-reference third subordinate structure consisting of three parallel metal lines 1004, 1006 and 1008 of length y is placed in the fourth test structure to cancel the effect of three metal parts of length y in the metal lines 900, 902 and 904, respectively. The three metal lines 1004, 1006 and 1008 are spaced a distance s apart and the parallel overlap length between them is y. Moreover, the three metal lines 1004, 1006 and 1008 are all the same as the line A.

When performing the second measurement step, the five metal lines 900, 902, 904, 906, and 908 are shorted together and connected to the output terminal $V_{out1}$ of the third branch circuit in FIG. 1. They are shorted together so there is no line-to-line coupling capacitance between the five metal lines. The five metal lines 1000, 1002, 1004, 1006, and 1008 are also shorted together and connected to the output terminal $V_{out2}$ of the fourth branch circuit. Also there is no line-to-line coupling capacitance between the five metal lines 1000, 1002, 1004, 1006, and 1008. Employing CBCM principle to cancel the equivalent capacitive components between the third and fourth test structures, the difference between the third and fourth test structures is a metal part of length L in the metal line 900. In other words, the total loading capacitance $C_{tot3}$ of the output terminal $V_{out1}$ of the third branch circuit with respect to ground and derived from the third test structure minus the total loading capacitance $C_{tot4}$ of the output terminal $V_{out2}$ of the fourth branch circuit with respect to ground and derived from the fourth test structure is the second coupling capacitance $C_{dummy}$.

The procedures for obtaining the second coupling capacitance $C_{dummy}$ are as follows. An average current $I_3$ flowing through the third branch circuit during a period of time is measured, and an average current $I_4$ flowing through the fourth branch circuit during the same period of time is also measured. These are done by using the two DC meters 108. According to the CBCM principle, $$I_3 = C_{tot3} * V_{dd} * f$$

$$I_4 = C_{tot4} * V_{dd} * f$$

and then the second coupling capacitance $C_{dummy}$ is calculated from the equation $$C_{dummy} = C_{tot3} - C_{tot4} = (I_3 - I_4)/(V_{dd} * f)$$

wherein $V_{dd}$ is the voltage of the supply terminal 106 and f is the clock frequency of the first voltage signal $V_1$ and the second voltage signal $V_2$.

After the completion of the two steps described above, since $C = 2C_c + 2C_f + C_a$ and $C_{dummy} = 2C_f + C_a$, the line-to-line coupling capacitance $C_c$ between the part 700a (equivalent to the line A) and the part 702b or 702c (equivalent to the line B) can then be determined easily according to the formula $C_c = (C - C_{dummy})/2$. In other words, capacitance $C_c$ is the line-to-line coupling capacitance between the line A and the line B. Note that in each of the two steps, the mismatch between two branch circuits used in the same step is incorporated in a respective one of the capacitances C and $C_{dummy}$ obtained, and therefore subtracting $C_{dummy}$ from C approximately cancels the mismatch components. As a result of this, the line-to-line coupling capacitance Cc obtained is very accurate. In addition, capacitance Cc to be measured may be smaller than $10^{-15}$ F (1 femto-farad).

All metal lines in all four test structures described above may belong to the same layer, and the line A and the line B also belong to this layer. As a result, the capacitance Cc is an intra-layer line-to-line coupling capacitance between the line A and the line B.

In conclusion, the new structures and method of the invention can improve the disadvantages of previous methods and test structures in the art such as those mentioned in the background section of this specification and satisfy the requirements of reduced mismatch effect, small test pattern size, simple measurement procedure, and high accuracy in intra-layer coupling capacitance extraction at the same time.

It will be apparent to those skilled in the art that various modifications and variations can be made regarding the structures of the present invention without departing from the scope or spirit of the invention. In view of the foregoing, it is intended that the present invention covers modifications and variations of the structures and their equivalents provided they fall within the scope of the appended claims.

What is claimed is:

1. A measuring device for measuring the coupling capacitance between two lines of an integrated circuit structure, the measuring device being used to measure a first coupling capacitance C and a second coupling capacitance $C_{dummy}$ of a target line of an integrated circuit structure of length L, the substrate of the integrated circuit structure being grounded, the measuring device comprising:

a first measuring set, comprising:
  a first branch circuit, comprising:
    a first transistor and a second transistor connected in series at a first node, wherein a terminal of the first transistor is connected to a high voltage and a terminal of the second transistor is connected to a low voltage, the first transistor is electrically opposite to the second transistor;
  a second branch circuit, comprising:
    a third transistor and a fourth transistor connected in series at a second node, wherein a terminal of the third transistor is connected to the high voltage and a terminal of the fourth transistor is connected to the low voltage, the third transistor is electrically opposite to the fourth transistor,
  wherein the first transistor is the same as the third transistor, the second transistor is the same as the fourth transistor, the control terminals of the first transistor and the third transistor are connected and driven by a first voltage signal, and the control terminals of the second transistor and the fourth transistor are connected and driven by a second voltage signal, the first voltage signal and the second voltage signal don't simultaneously turn on the transistors of each branch circuit;
  a first test structure, coupled to said first node, comprising:
    a first line connected to said first node, the first line being the same as the target line and longer than the target line; and
    two second lines placed at the two sides of said first line, which are parallel to and equally away from said first line and are grounded,
    wherein the distance and parallel overlap length between said first line and each of said two second lines are s and x+L, respectively; and
  a second test structure, coupled to said second node, comprising:
    a third line connected to said second node, said third line being the same as said first line and shorter than said first line; and
    two fourth lines placed at the two sides of said third line, which are parallel to and equally away from said third line and are grounded, wherein the distance and parallel overlap length between said third line and each of said two fourth lines are s and x respectively, said two fourth lines are the same as said two second lines and shorter than said two second lines,
  wherein the length of said first line minus the length of said third line equals L, the total loading capacitance of said first node derived from said first test structure with respect to ground minus that of said second node derived from said second test structure with respect to ground is said first coupling capacitance C of said target line of length L; and
a second measuring set, comprising:
  a third branch circuit, comprising:
    a fifth transistor and a sixth transistor connected in series at a third node, wherein a terminal of the fifth transistor is connected to said high voltage and a terminal of the sixth transistor is connected to said low voltage, the fifth transistor is electrically opposite to the sixth transistor;
  a fourth branch circuit, comprising:
    a seventh transistor and an eighth transistor connected in series at a fourth node, wherein a terminal of the seventh transistor is connected to the high voltage and a terminal of the eighth transistor is connected to the low voltage, said seventh transistor is electrically opposite to said eighth transistor,
  wherein the fifth transistor and the seventh transistor are the same as the first transistor, the sixth transistor and the eighth transistor are the same as the second transistor, the control terminals of the fifth transistor and the seventh transistor are connected and driven by said first voltage signal, and the control terminals of the sixth transistor and the eighth transistor are connected and driven by said second voltage signal, the first voltage signal and the second voltage signal don't simultaneously turn on the transistors of each branch circuit;
  a third test structure, coupled to said third node, comprising:
    a first subordinate structure comprising:
      a fifth line of length y+L, said fifth line being the same as said target line and longer than said target line; and
      two sixth lines of length y+L placed at the two sides of said fifth line, which are parallel to and equally away from said fifth line, said two sixth lines being the same as said fifth line,
      wherein the distance and parallel overlap length between said fifth line and each of said two sixth lines are s and y+L, respectively; and
    a second subordinate structure comprising:
      two parallel seventh lines of length y spaced a distance of s apart, wherein the parallel overlap length between the two seventh lines is y, said two seventh lines being the same as said fifth line,
    wherein said five lines are shorted together and connected to said third node; and
  a fourth test structure, coupled to said fourth node, comprising:
    a third subordinate structure comprising:
      three parallel eighth lines of length y spaced a distance of s apart, said three eighth lines being the same as said fifth line, wherein the parallel overlap length between the three eighth lines is y; and
    a fourth subordinate structure comprising:
      two parallel ninth lines of length y+L spaced a distance of s apart, said two ninth lines being the same as said fifth line, wherein the parallel overlap length between the two ninth lines is y+L,
    wherein the five lines are shorted together and connected to said fourth node,
  wherein the total loading capacitance of said third node derived from said third test structure minus that of said fourth node derived from said fourth test structure is said second coupling capacitance $C_{dummy}$ of said target line of length L.

2. The measuring device of claim 1, wherein said first coupling capacitance C essentially includes a line-to-line capacitance $C_c$ between a part of said first line of length L and each of said two second lines, a fringe capacitance $C_f$ between each lateral edge of said part and the substrate of the integrated circuit structure, and an area capacitance $C_a$ between the bottom area of said part and the substrate; said first coupling capacitance C is equal to $2C_c+2C_f+C_a$.

3. The measuring device of claim 1, wherein said second coupling capacitance $C_{dummy}$ essentially includes a fringe capacitance $C_f$ between each lateral edge of a part of said fifth line of length L and the substrate of the integrated circuit structure, and an area capacitance $C_a$ between the bottom area of said part and the substrate; said second coupling capacitance $C_{dummy}$ is equal to $2C_f+C_a$.

4. The measuring device of claim 1, wherein all of said lines of said four test structures are in a same metallization layer formed on the substrate of the integrated circuit structure.

5. The measuring device of claim 1, wherein said first transistor, said third transistor, said fifth transistor and said seventh transistor are PMOS field effect transistors.

6. The measuring device of claim 1, wherein said second transistor, said fourth transistor, said sixth transistor and said eighth transistor are NMOS field effect transistors.

7. A method for measuring a line-to-line coupling capacitance $C_c$ between a line A and a line B of an integrated circuit structure of length L, the substrate of the integrated circuit structure being grounded, the method comprising:

employing said first measuring set of claim 1, wherein said first line is the same as said line A and said two second lines are the same as said line B, measuring a first average current $I_1$ during a first period of time flowing through said first branch circuit and a second average current $I_2$ during said first period of time flowing through said second branch circuit, and calculating a first capacitance C from the equation $C=(I_1-I_2)/(V_{dd}*f)$, wherein $V_{dd}$ is said high voltage of claim 1 and f is the clock frequency of said voltage signals of claim 1;

employing said second measuring set of claim 1, wherein said fifth line, said two sixth lines, said two seventh lines, said three eighth lines and said two ninth lines are the same as said line A, measuring a third average current $I_3$ during a second period of time flowing through said third branch circuit and a fourth average current $I_4$ during said second period of time flowing through said fourth branch circuit, and calculating a second capacitance $C_{dummy}$ from the equation $C_{dummy}=(I_3-I_4)/(V_{dd}*f)$, wherein $V_{dd}$ is said high voltage of claim 1 and f is the clock frequency of said voltage signals of claim 1; and determining said line-to-line coupling capacitance $C_c$ between said line A and said line B according to the formula $C_c=(C-C_{dummy})/2$.

8. The method of claim 7, wherein said first capacitance C essentially includes said line-to-line coupling capacitance $C_c$ between said line A and said line B of length L, a fringe capacitance $C_f$ between each lateral edge of said line A and the substrate of the integrated circuit structure, and an area capacitance $C_a$ between the bottom area of said line A and the substrate; said first capacitance C is equal to $2C_c+2C_f+C_a$.

9. The method of claim 7, wherein said second capacitance $C_{dummy}$ essentially includes said fringe capacitance $C_f$ between each lateral edge of said line A and the substrate of the integrated circuit structure, and said area capacitance $C_a$ between the bottom area of said line A and the substrate; said second capacitance $C_{dummy}$ is equal to $2C_f+C_a$.

10. The method of claim 7, wherein all of the lines of the test structures of said first measuring set and said second measuring set of claim 1 are in a same metallization layer formed on the substrate of the integrated circuit structure.

11. The method of claim 7, wherein the transistors of said first measuring set and said second measuring set of claim 1 connected to said high voltage $V_{dd}$ are PMOS field effect transistors.

12. The method of claim 7, wherein the transistors of said first measuring set and said second measuring set of claim 1 connected to said low voltage of claim 1 are NMOS field effect transistors.

13. The method of claim 7, wherein said line-to-line coupling capacitance $C_c$ between said line A and said line B is less than one femtoFarad.

* * * * *